United States Patent [19]

Sibiga

[11] Patent Number: 4,746,876
[45] Date of Patent: May 24, 1988

[54] ATTENUATOR CONTROL ARRANGEMENTS

[75] Inventor: Antoni J. Sibiga, Dollard des Ormeaux, Canada

[73] Assignee: Northern Telecom Limited, Montreal, Canada

[21] Appl. No.: 944,023

[22] Filed: Dec. 22, 1986

[51] Int. Cl.[4] .................... H03G 3/30; H03G 17/00
[52] U.S. Cl. ................................. 330/284; 330/59
[58] Field of Search .............. 330/52, 59, 132, 284, 330/308

[56] References Cited

U.S. PATENT DOCUMENTS 3,360,737 12/1967 Harris et al. ........................... 330/59
4,468,631 8/1984 Goldberg ............................. 330/284

Primary Examiner—Gene Wan
Assistant Examiner—Steven J. Mottola
Attorney, Agent, or Firm—R. John Haley

[57] ABSTRACT

An attenuator control arrangement for use in a frequency multiplexed communications system includes a light-dependent attenuating resistance which is controlled in normal operation by the level of a pilot tone, in the multiplexed signal being attenuated, being used to control a light-emitting diode which illuminates the light-dependent resistance. A second light-dependent resistance also illuminated by the light-emitting diode is used to provide a control signal for the light-emitting diode in the event that the pilot tone is not detected, whereby a stable attenuation is provided in the absence of the pilot tone.

4 Claims, 1 Drawing Sheet

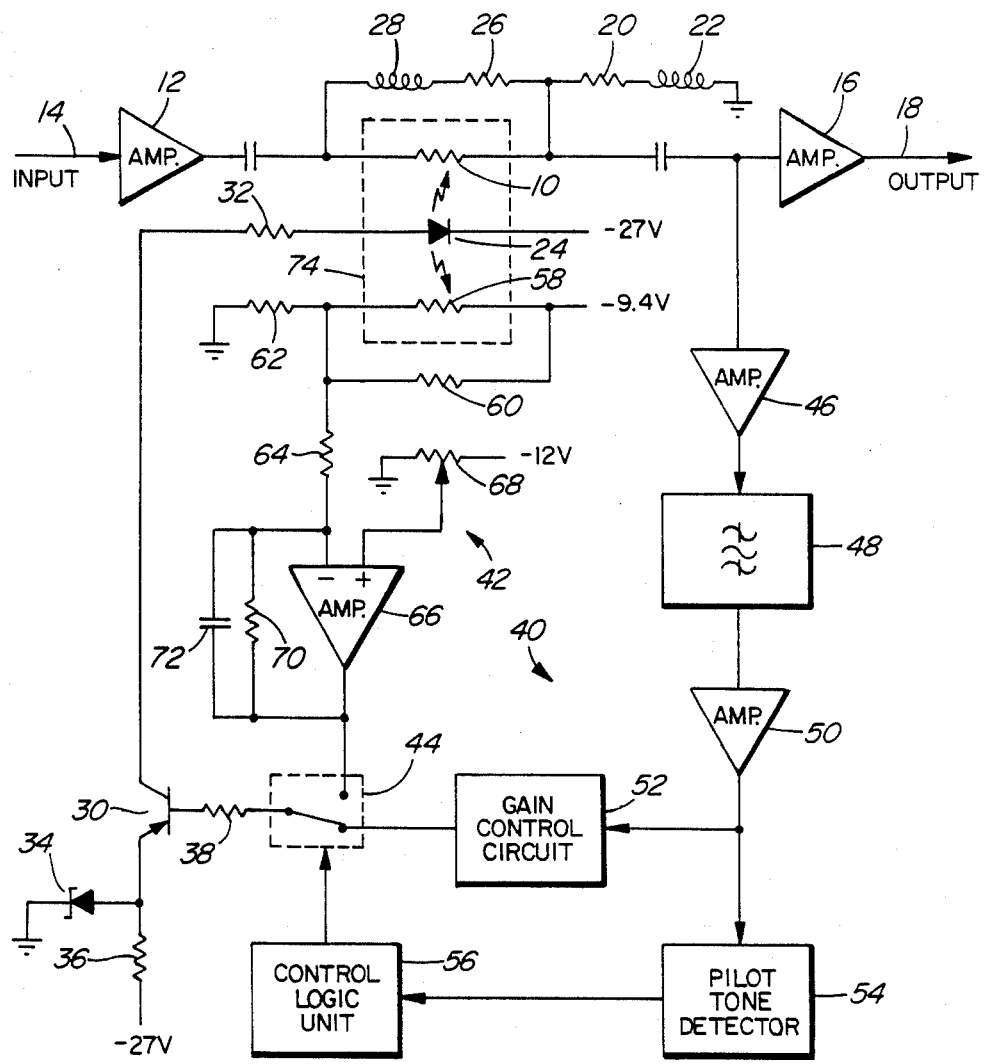

ATTENUATOR CONTROL ARRANGEMENTS

This invention relates to attenuator control arrangements, and is particularly concerned with an attenuator control arrangement which is suitable for level control of signals in frequency multiplexed communications systems.

In a frequency multiplexed communications system, it is desirable to control the level of transmitted signals rapidly and over a wide dynamic range, without introducing distortion or noise to the signals. In addition, such control is desirably effected in a simple manner at a relatively low cost, for signals with a wide range of frequencies, and in a manner which is stable with respect to temperature changes.

An object of this invention is to provide an attenuator control arrangement which can facilitate level control of signals, particularly in a frequency multiplexed communications system.

According to this invention there is provided an attenuator control arrangement comprising: an attenuator comprising a potential divider including a first light-dependent resistance; a second potential divider including a second light-dependent resistance; a light source for illuminating the first and second light-dependent resistances; control means responsive to a control signal for controlling the light source thereby to control the magnitudes of the first and second light-dependent resistances; means for producing a first control signal in response to differences between a potential derived from the second potential divider and a reference potential, means for producing a second control signal in dependence upon a level of a predetermined signal at an output of the attenuator; and switching means responsive to the absence or presence of the predetermined signal for selecting respectively the first or second control signal as the control signal for the control means, whereby the attenuator has an attenuation determined by respectively the reference potential or the level of the predetermined signal. In an embodiment of the invention, conveniently the predetermined signal comprises a pilot tone having a predetermined frequency, the arrangement including a bandpass filter for passing the predetermined frequency coupled between the output of the attenuator and the means for producing the further control signal.

Such an arrangement is particularly suited to attenuation of frequency multiplexed signals, including a pilot tone, in a communications sytem. In normal operation, the pilot tone is filtered and detected, and the light source is controlled in dependence upon the pilot tone level so that a desired signal level is maintained at the output of the attenuator. In the event of failure to detect an appropriate level of the pilot tone (e.g. loss of the pilot tone signal) a stable attenuation (as opposed to a very low attenuation due to the low or zero level of pilot tone) is achieved in that the attenuator is controlled by the first-mentioned control signal.

The invention will be further understood from the following description with reference to the accompanying drawing, which schematically illustrates an attenuator control arrangement in accordance with an embodiment of the invention.

Referring to the drawing, the attenuator control arrangement illustrated therein comprises a cadmium selenide photoconductive cell which constitutes a variable resistance 10 which is capacitively coupled in series between the output of a main signal amplifier 12, which is supplied with a frequency multiplexed input signal via an input 14, and an output drive amplifier 16 which supplies a constant-level signal to an output 18. The resistance 10 serves, together with a resistor 20 connected in series with an inductor 22 between the output side of the resistance 10 and ground, to constitute a variable attenuator controlled optically by light from a light-emitting diode (led) 24. A series-connected resistor 26 and inductor 28 are connected in parallel with the resistance 10 to provide a desired upper limit of attenuation.

Current through the led 24, and hence its light output and the magnitude of the resistance 10, is controlled by a transistor 30, the collector of which is connected to the led 24 via a resistor 32 and the emitter of which is maintained at a constant potential by a zener diode 34 biassed via a resistor 36. Base current to the transistor 30, limited by a series resistor 38, is derived from either of two feedback paths 40 and 42, depending on the position of an analog switch 44.

The feedback path 40 comprises a pilot tone drive amplifier 46, whose input is connected to the input of the amplifier 16 and hence receives the attenuated signal from the output side of the resistance 10, a pilot tone bandpass filter 48 coupled to the output of the amplifier 46, a pilot tone rectifying amplifier 50 coupled to the output of the filter 48, and a gain control circuit 52 coupled between the output of the amplifier 50 and one position of the switch 44. In addition, a pilot tone detector 54 is coupled to the output of the amplifier 50 for detecting an appropriate level of a pilot tone, which is normally present in the frequency multiplexed signal supplied to the input 14, and upon such detection supplying a control signal to a control logic unit 56 which controls the switch 44. In the presence of the pilot tone at an appropriate level the switch 44 has the position shown, in which the output of the circuit 52 is connected to the resistor 38.

For example, the pilot tone may have a frequency of 1.552 MHz, and the pilot tone detector 54 may comprise a window comparator, the appropriate level of the pilot tone being anywhere within a range corresponding to the comparator window. The gain control circuit 52 can comprise a delay element and a level comparator for comparing the delayed pilot tone level with a predetermined reference level.

The feedback path 42 includes a second cadmium selenide photoconductive cell constituting a resistance 58, also responsive to the light output of the led 24, which resistance 58 is connected in a potential divider circuit including resistors 60 and 62 to provide a voltage which is coupled via a resistor 64 to an inverting input of a differential amplifier 66. A manually variable voltage divider 68 supplies a reference voltage to a non-inverting input of the amplifier 66, whose output is connected to another position of the switch 44, to be connected to the resistor 38 in the absence of the pilot tone. A feedback resistor 70 and capacitor 74 provide for stable operation of the amplifier 66.

In normal operation, with the pilot tone present, at a level within the range set by the window comparator, in the input signal supplied to the input 14, this pilot tone is detected by the detector 54 so that the switch 44 is controlled to have the position shown, whereby the level of the pilot tone is monitored by the gain control circuit 52 and thereby maintained constant by feedback control via the switch 44, transistor 30, and led 24 controlling the resistance 10. As the pilot tone has a level which is fixed relative to the remainder of the frequency multiplexed input signal, so the level of this signal at the output 18 is also maintained constant.

In the event that the pilot tone level is outside the range set by the window comparator, for example in the event of a loss of signal at the input 14, it is desirable to avoid a situation in which the variable resistance 10 provides a very low attenuation, whereby substantial levels of noise are supplied to the output 18. In this situation, the failure of the detector 54 to detect the pilot tone results in the unit 56 controlling the switch to adopt its other position, in which the output of the amplifier 66 controls the transistor 30 and hence light output of the led 24, and thereby the attenuation by the resistance 10. As a result of the feedback provided by the resistance 58, this attenuation is held at a desired level established by the setting of the variable voltage divider 68.

As indicated by a broken line box 74 in the drawing, the led 24 and resistances 10 and 58 are conveniently all part of a single led/photocell module, such as that available from Silonex Inc. under part No. PL-5S33 comprising a gallium phosphide led and two fast-responding cadmium selenide photoconductive cells optically coupled thereto. The integration of the resistances 10 and 58 in the same module results in close matching and thermal coupling, whereby the feedback path 42 automatically compensates for changes in the characteristics of the led 24 and resistance 10 with changing temperature.

Although a particular embodiment of the invention has been described in detail above, it should be appreciated that numerous modifications, variations, and adaptations may be made thereto without departing from the scope of the invention, which is defined by the claims.

What is claimed is:
1. An attenuator control arrangement comprising:
   an attenuator comprising a first potential divider including a first light-dependent resistance;
   a second potential divider including a second light-dependent resistance;
   a light source for illuminating the first and second light-dependent resistances;
   control means responsive to a control signal for controlling the light source thereby to control the magnitudes of the first and second light-dependent resistances;
   means for producing a first control signal in response to differences between a potential derived from the second potential divider and a reference potential;
   means for producing a second control signal in dependence upon a level of a predetermined signal at an output of the attenuator; and
   switching means responsive to the absence or presence of the predetermined signal for selecting respectively the first or second control signal as the control signal for the control means, whereby the attenuator has an attenuation determined by respectively the reference potential or the level of the predetermined signal.
2. An arrangement as claimed in claim 1 wherein the predetermined signal comprises a pilot tone having a predetermined frequency, the arrangement including a bandpass filter for passing the predetermined frequency coupled between the output of the attenuator and the means for producing the second control signal.
3. An arrangement as claimed in claim 2 wherein the first and second light-dependent resistances comprise cadmium selenide photoconductive cells.
4. An arrangement as claimed in claim 3 wherein the light source comprises a light emitting diode

* * * * *